United States Patent
Tsai

(10) Patent No.: US 8,081,480 B2
(45) Date of Patent: Dec. 20, 2011

(54) FIXING MODULE AND CASE HAVING THE FIXING MODULE

(75) Inventor: Wen-Cheng Tsai, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 369 days.

(21) Appl. No.: 12/414,644

(22) Filed: Mar. 30, 2009

(65) Prior Publication Data

US 2009/0296358 A1 Dec. 3, 2009

(30) Foreign Application Priority Data

May 30, 2008 (TW) ................................ 97120270 A

(51) Int. Cl.
*H05K 5/00* (2006.01)
*H05K 1/14* (2006.01)

(52) U.S. Cl. ........................................ 361/732; 361/740

(58) Field of Classification Search .......... 361/769–801, 361/755, 759, 728–732, 740, 747, 752, 754; 211/41.17; 174/50
See application file for complete search history.

(56) References Cited

U.S. PATENT DOCUMENTS

| | | | | |
|---|---|---|---|---|
| 6,160,712 A * | 12/2000 | Itai et al. | ......................... | 361/759 |
| 6,185,104 B1 * | 2/2001 | Obermaier | ..................... | 361/759 |
| 6,618,264 B2 * | 9/2003 | Megason et al. | ............... | 361/759 |
| 6,693,802 B2 * | 2/2004 | Vier et al. | ...................... | 361/801 |
| 6,738,261 B2 * | 5/2004 | Vier et al. | ...................... | 361/740 |
| 6,970,363 B2 | 11/2005 | Bassett et al. | | |
| 7,012,813 B2 * | 3/2006 | Wang et al. | .................... | 361/801 |
| 7,057,902 B2 * | 6/2006 | Li | ................................. | 361/801 |
| 7,254,040 B2 * | 8/2007 | Barina et al. | ................... | 361/801 |
| 7,265,997 B2 * | 9/2007 | Jing | .............................. | 361/801 |
| 7,545,650 B2 * | 6/2009 | Sanchez et al. | ................ | 361/759 |
| 7,561,440 B2 * | 7/2009 | Dai | ................................ | 361/801 |
| 7,715,199 B2 * | 5/2010 | Chou | ............................ | 361/732 |
| 2007/0076399 A1 * | 4/2007 | Barina et al. | ................... | 361/801 |

FOREIGN PATENT DOCUMENTS

| | | |
|---|---|---|
| CN | 2754145 | 1/2006 |
| CN | 2906725 | 5/2007 |

* cited by examiner

*Primary Examiner* — Lisa Lea Edmonds
*Assistant Examiner* — Xanthia C Cunningham
(74) *Attorney, Agent, or Firm* — Jianq Chyun IP Office

(57) ABSTRACT

A fixing module for fixing a card module and a case having the fixing module are provided. The fixing module includes a base and a sliding element. The base is disposed on a bracket and includes a carrying portion, a cantilever hook, and a constraining structure. The sliding element includes a resilient portion and a body. The body is movably disposed on the carrying portion of the base. The constraining structure is adapted to contact the body and constrain a movement of the body when the sliding element is in a locked position, and the resilient portion constrains the locking bracket of the card module on the bracket. When a force is exerted on the cantilever hook to disengage the constraining structure from the body, the sliding element is moved to an unlocked position under the influence of an elastic restoring force of the resilient portion.

21 Claims, 9 Drawing Sheets

FIXING MODULE AND CASE HAVING THE FIXING MODULE

CROSS-REFERENCE TO RELATED APPLICATION

This application claims the priority benefit of Taiwan application serial no. 97120270, filed on May 30, 2008. The entirety of the above-mentioned patent application is hereby incorporated by reference herein and made a part of specification.

BACKGROUND OF THE INVENTION

1. Field of the Invention

The present invention generally relates to a fixing module and a case having the fixing module, and particularly to a fixing module and a case having the fixing module that is convenient for dismounting a card module.

2. Description of Related Art

A computer generally includes a display, a host, and peripherals. The display is the so called screen. The peripherals include a mouse, a keyboard, a printer, a scanner, and a digital camera. The main function of the host is data computing and storing. The computer host mainly includes a case, a motherboard, a memory module, a central processing unit (CPU), a card module, a power supply, and data storage equipment. The data storage equipment includes a floppy disk drive, a hard disk drive, an optical disk drive, a CD/DVD burner, or the like. Common card modules include a sound card, a graphics card, a network card, and an adapter.

In the computer host, the card module is plugged into the expansion slot on the motherboard, the end of the card module with connectors is locked to a rear panel of the computer case, and the connectors are exposed by openings of the rear panel. As such, the connectors of the card module can be fixed to the computer case, so that external devices can be stably connected to the connector to provide the function of, such as, sound output, image output, data transmission or conversion. When the card module is mounted to the case, the card of the card module is plugged into the expansion slot of the motherboard, and the locking bracket in front of the card is locked to the case using screws.

However, to remove the card module from the expansion slot of the motherboard, tools such as a screw driver are required to remove the screws extending through the mounting holes of the locking bracket and the case, which causes inconvenience in use.

SUMMARY OF THE INVENTION

Accordingly, the present invention is directed to a fixing module that is convenient in dismounting and mounting the card module.

The present invention is also directed to a case that is convenient in dismounting and mounting the card module.

The present invention provides a fixing module for fixing a card module to a bracket. The card module includes a locking bracket and a card. The fixing module includes a base and a sliding element. The base is disposed on the bracket and includes a carrying portion, a cantilever hook, and a first constraining structure. The sliding element includes a resilient portion and a body. The body is movably disposed on the carrying portion of the base. When the sliding element is in a locked position, the first constraining structure is adapted to contact the body and constrain a movement of the body, and the resilient portion constrains the locking bracket of the card module on the bracket. When a force is exerted on the cantilever hook to disengage the first constraining structure from the body, the sliding element is moved to an unlocked position under the influence of an elastic restoring force of the resilient portion.

The present invention also provides a case that includes a first bracket and a fixing module described above.

According to one embodiment of the present invention, the first constraining structure is a stepping structure formed between the cantilever hook and the carrying portion.

According to one embodiment of the present invention, the base further has two locking slots, the sliding element further has two locking portions formed on a side of the body away from the resilient portion, and the locking portions are engaged in the locking slots when the sliding element is in the locked position.

According to one embodiment of the present invention, the base further has two sliding slots at opposite sides of the carrying portion, the sliding element further has two guiding pins on opposite sides of the resilient portion, and the guiding pins are movably disposed in the sliding slots.

According to one embodiment of the present invention, the first bracket further has a mounting hole, the base further has a first mounting portion formed on a side of the carrying portion away from the cantilever hook, and the first mounting portion is configured to be inserted into the mounting hole of the first bracket.

According to one embodiment of the present invention, the resilient portion of the sliding element is S-shaped.

According to one embodiment of the present invention, the first bracket further has a first mounting hole, the locking bracket further has a second mounting hole, the sliding element further has a protruding post formed on a surface of the resilient portion away from the body, and the protruding post extends through the first mounting hole of the first bracket and into the second mounting hole of the locking bracket when the sliding element is in the locked position.

According to one embodiment of the present invention, the sliding element further has a second mounting portion, and the second mounting portion protrudes from the resilient portion in a direction substantially parallel to the movement direction of the sliding element.

According to one embodiment of the present invention, the sliding element further has at least one rib formed on a surface of the resilient portion away from the body.

According to one embodiment of the present invention, the sliding element further includes a pushing portion formed on a side of the body away from the resilient portion, for allowing a user to exert a force on the pushing portion.

According to one embodiment of the case, the case further includes a plurality of second brackets cooperating with the first bracket to form a container.

The card module can be mounted to the first bracket of the case by using the fixing module. When it is desired to dismount the card module, the cantilever hook of the base can be simply pressed to disengage the sliding element from the first constraining structure, the sliding element can be moved from the locked position to the unlocked position under the influence of its own elastic restoring force, so that the card module can be readily dismounted. It is convenient for users to mount or dismount the card module onto the case by means of the fixing module.

In order to make the aforementioned and other features and advantages of the present invention more comprehensible, embodiments accompanied with figures are described in detail below.

DESCRIPTION OF THE EMBODIMENTS

Figure 1:
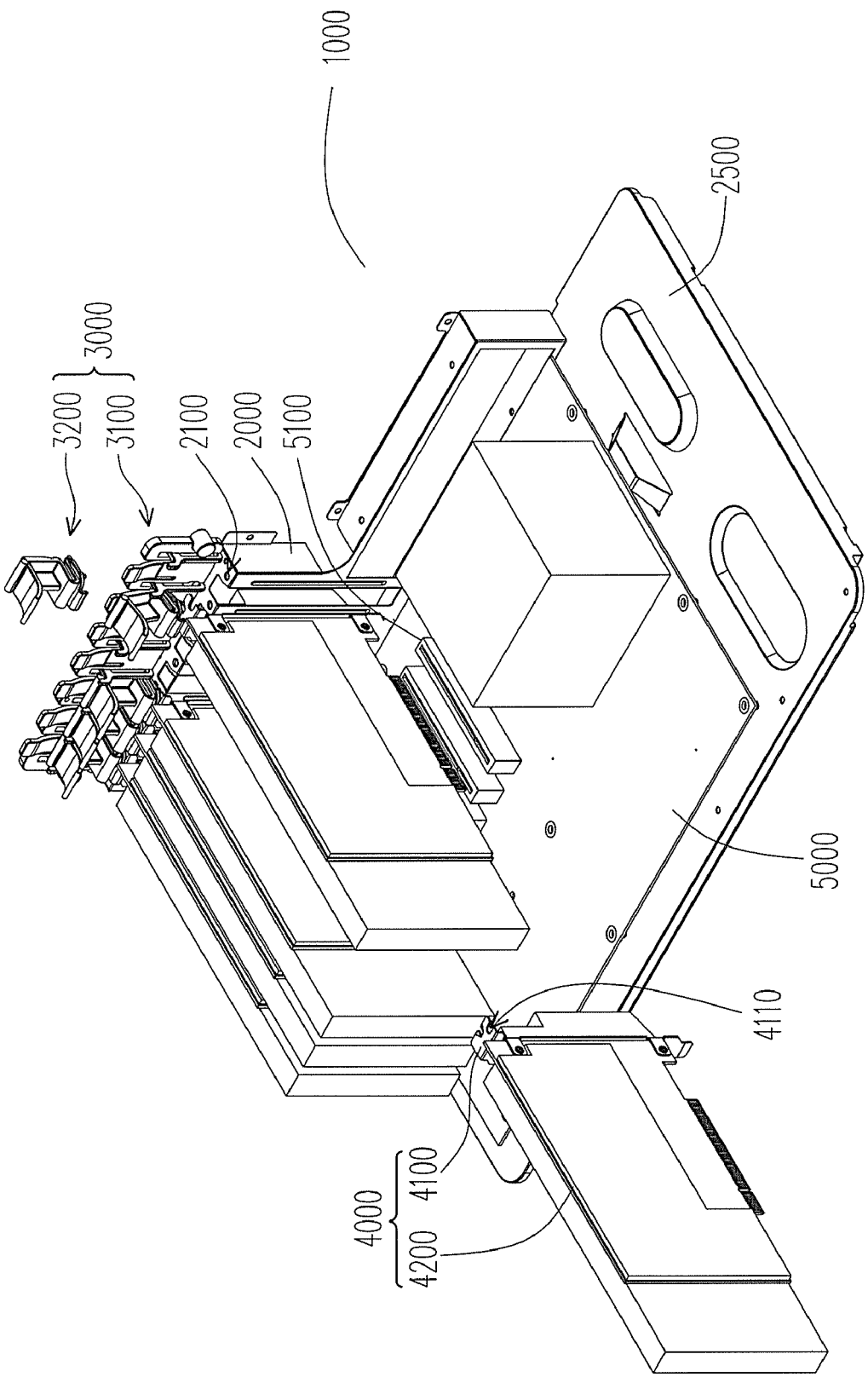
FIG. 1 is a schematic view of a case and a card module according to one embodiment of the present invention.

FIG. 1 is a schematic view of a case and a card module according to one embodiment of the present invention. Referring to FIG. 1, the case 1000 of the present embodiment includes a first bracket 2000 and at least one fixing module 3000. The fixing module 3000 is mounted to the first bracket 2000 and used to fix a card module 4000 to the first bracket 2000. In the present embodiment, the case 1000 may be a case of a computer host, which further includes a plurality of second brackets 2500 (only one second bracket 2500 is illustrated in FIG. 1). The first bracket 2000 and the second brackets 2500 may be assembled to form a container. For an ease of description, only a part of the container is shown in FIG. 1. The material of the first bracket 2000 and the second bracket 2500 may be metal or other suitable materials. A motherboard 5000 can be received in the container formed by the first bracket 2000 and the second brackets 2500. A card module 4000 is adapted to be plugged onto the motherboard 5000 and mounted with the case 1000 to enhance the stability of the plugging connection between the card module 4000 and the motherboard 5000. Specifically, the card module 4000 includes a locking bracket 4100 and a card 4200. A gold finger formed at one side of the card 4200 is adapted to be inserted into a corresponding insertion slot 5100 of the motherboard 5000 to establish an electrical connection between the card 4100 and the motherboard 5000. The locking bracket 4100 having a second mounting hole 4110 is disposed on a side that is adjacent the first bracket 2000 of the card 4200.

Figure 2:
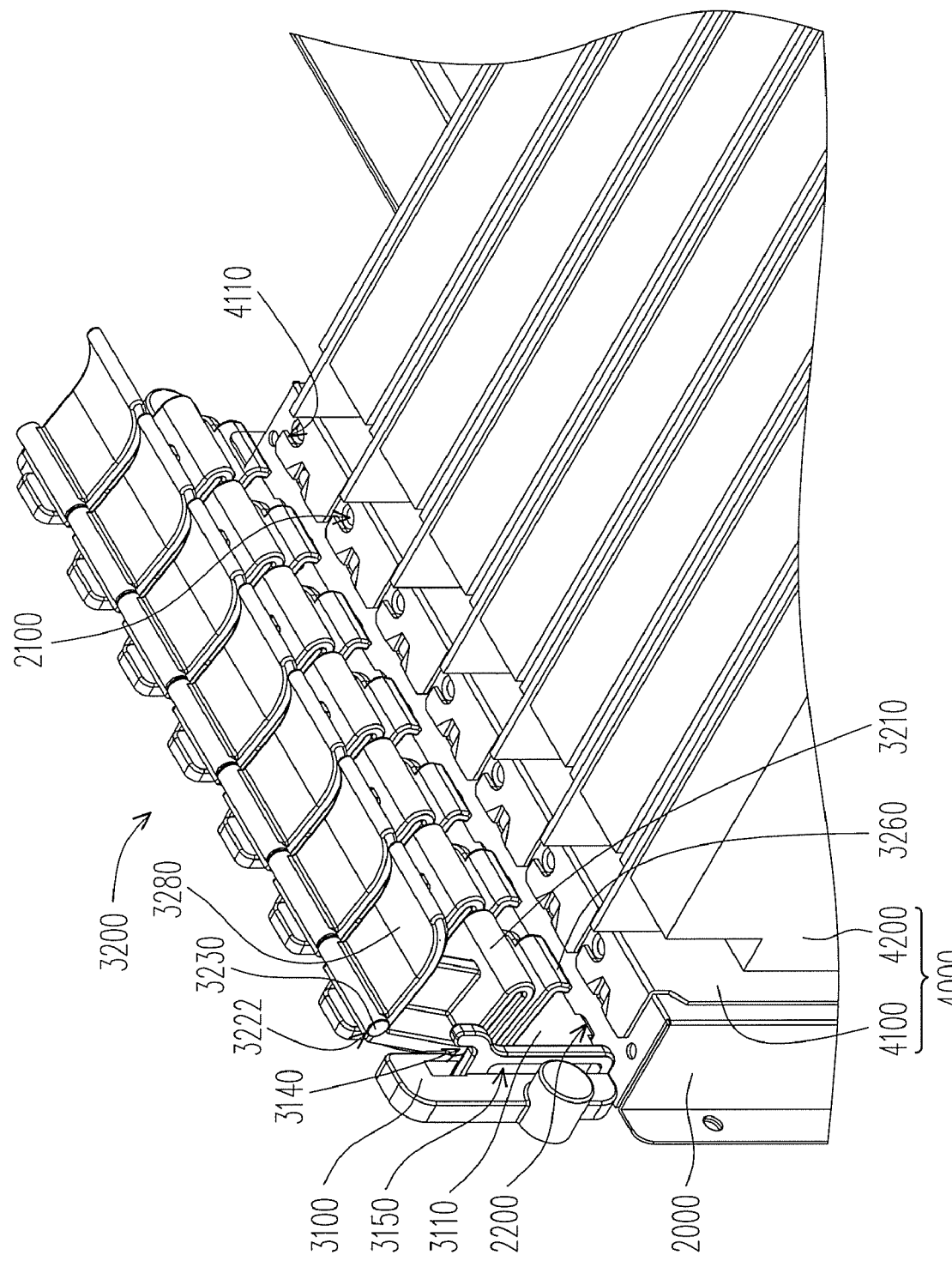
FIG. 2 is a partial view of the fixing module depicted in FIG. 1 in a position where the card module is not constrained to the first bracket.
Figure 3:
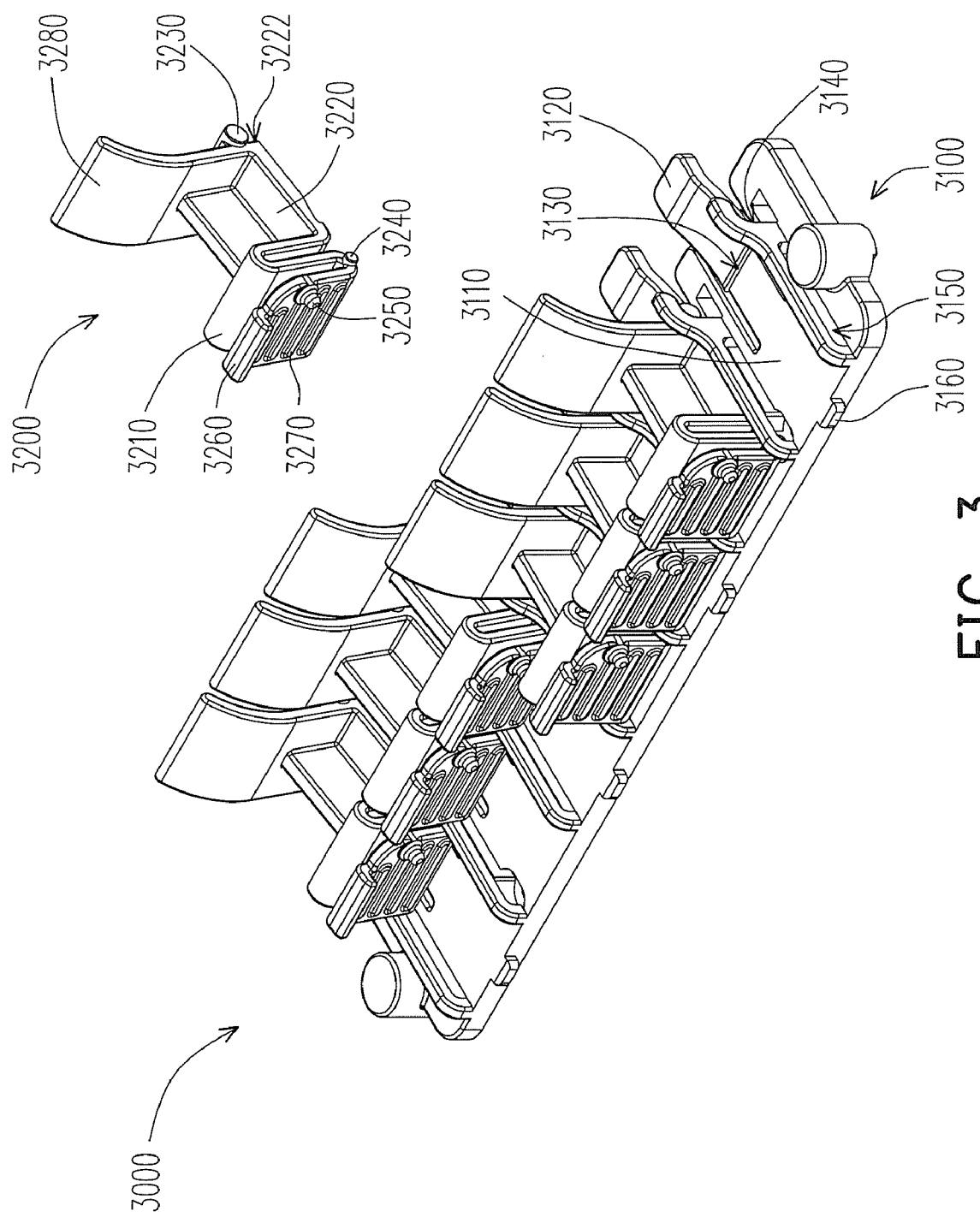
FIG. 3 is a schematic view of the fixing module depicted in FIG. 2.

FIG. 2 is a partial view of the fixing module depicted in FIG. 1 in a position where the card module is not constrained to the first bracket. FIG. 3 is a schematic view of the fixing module depicted in FIG. 2. Referring to FIG. 2 and FIG. 3, the fixing module 3000 of the present embodiment includes a base 3100 and a plurality of sliding elements 3200, where the base 3100 disposed on the first bracket 2000. The material of the base 3100 and the sliding elements 3200 may be plastic or other suitable materials. The base 3100 includes a plurality of carrying portions 3110, a plurality of cantilever hooks 3120, and a plurality of first constraining structures 3130. The first constraining structure 3130 is, for example, a stepping structure formed between the cantilever hook 3120 and the carrying portion 3110. The sliding element 3200 has a resilient portion 3210 and a body 3220. The body 3220 is movably disposed on the carrying portion 3110 of the base 3100. When the fixing module 3000 fixes the card module 4000 on the first bracket 2000, the slide member 3200 is in a locked position, the first constraining structure 3130 contacts the body 3220 to constrain a movement of the body 3220, and the resilient portion 3210 constrains the locking member 4100 of the card module 4000 on the first bracket 2000.

The base 3100 may further include a plurality of locking slots 3140. The sliding element 3230 includes two locking portions 3230 formed at one side of the body 3220 away from the resilient portion 3210. When the fixing module 3000 fixes the card module 4000 to the first bracket 2000, the locking portions 3230 of the sliding element 3200 are constrained by the locking slots 3140 of the base 3100 thus securing the sliding element 3200 in a locked position. Furthermore, the resilient portion 3210 of the sliding element 3200 can constrain the locking bracket 4100 of the card module 4000 on the first bracket 2000.

In addition, the base 3100 further has a plurality of sliding slots 3150 at two sides of the carrying portions 3110. The sliding element 3200 further includes two guiding pins 3240 at two sides of the resilient portion 3210. The guiding pins 3240 are movably disposed in the sliding slots 3150. As such, the sliding element 3200 can move relatively to the carrying portion 3110 of the base 3100. And, the engagement of the guiding pins 3240 in the sliding slots 3150 can limit the scope of movement of the sliding element 3200 and prevent the sliding element 3200 from becoming disengaged from the base 3100. Therefore, missing of the sliding element 3200 can be avoided.

As shown in FIG. 2 and FIG. 3, the first bracket 2000 further has a third mounting hole 2200, and the base further includes a first mounting portion 3160 such as a protruding flange structure. The first mounting portion 3160 is disposed at a side of the carrying portion 3110 that is away from the cantilever hook 3120. The first mounting portion 3160 is used to be inserted into the third mounting hole 2200 of the first bracket 2000 to mount the base 3100 to the first bracket 2000. In alternative embodiments, the base 3100 may be mounted to the first bracket 2000 at the two sides of the base 3100 with screws (not shown).

The sliding element 3200 further includes a protruding post 3250 formed on a surface of the body 3220 that is away from the resilient portion 3210. When the sliding element 3200 is in a locked position, the protruding post 3250 extends into the first mounting hole 2100 of the first bracket 2000 and the second mounting hole 4100 of the locking bracket 4100 to constrain the locking bracket 4100 on the first bracket 2000.

In addition, the sliding element 3200 further includes a second mounting portion 3260. Similar to the first mounting portion 3160, the second mounting portion 3260 is also, for example, a protruding flange structure that may protrude from the resilient portion 3210 in a direction parallel to the moving direction of the sliding element 3200. When the sliding element 3200 is in the locked position, the second mounting portion 3260 leans against the locking bracket 4100 to constrain the locking bracket 4100.

Moreover, the sliding element 3200 includes at least one rib 3270. In the present embodiment, the sliding element 3200 includes a plurality of ribs 3270. The ribs 3270 are disposed on a surface of the resilient portion 3210 that is away from the body 3220. When the sliding element 3200 is in the locked position, the ribs 3270 contact a surface of the locking bracket 4100 that faces the resilient portion 3210. The ribs 3270 can increase the stability of the contact between the sliding element 3200 and the locking bracket 4100.

Furthermore, the sliding element 3200 includes a pushing portion 3280. The pushing portion 3280 is disposed on a side of the body 3220 that is away from the resilient portion 3210, for allowing the user to exert a force on the pushing portion 3280 to move the sliding element 3200 relative to the base 3100.

The fixing module 3000 shown in FIG. 3 includes the base 3100 and the plurality of sliding elements 3200. In an alternative embodiment, however, the fixing module may include a single base mounted on the first bracket and a single sliding element according to needs. In another alternative embodiment, the fixing module may include a plurality of separate bases and a plurality of sliding elements, with each base corresponding to a corresponding one of the sliding elements.

In general, the gold finger of the card 4200 of the card module 4000 is first inserted into the insertion slot 5100 of the motherboard 5000, and the fixing module 3000 of the present embodiment is then used to fix the card module 4000 to the first bracket 2000. The steps of fixing the card module 4000 to the first bracket 2000 by using the fixing module 3000 is described in detail below.

Figure 4A:
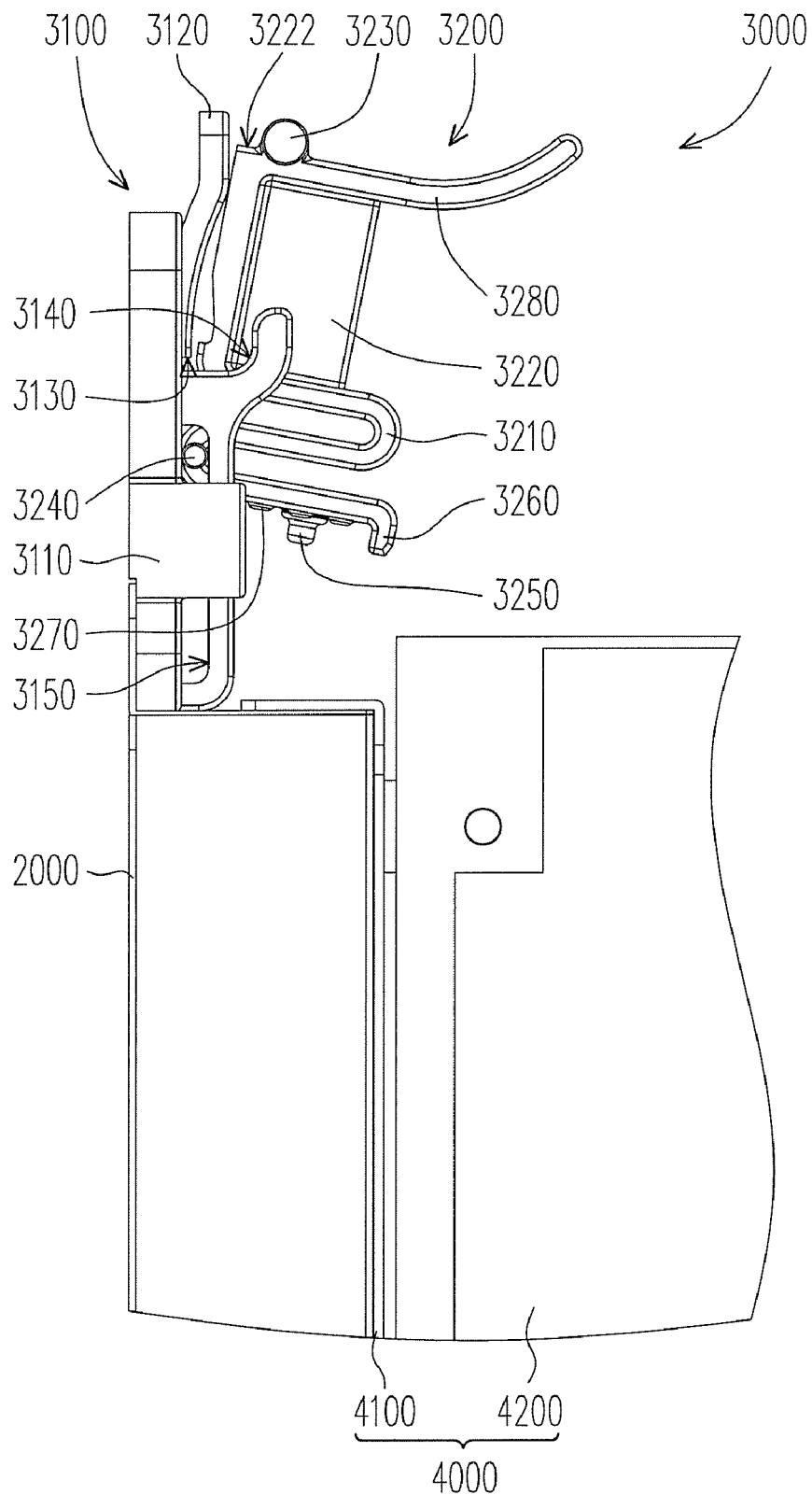
FIG. 4A is a side view of the fixing module depicted in FIG. 2 in an unlocked position.
Figure 4B:
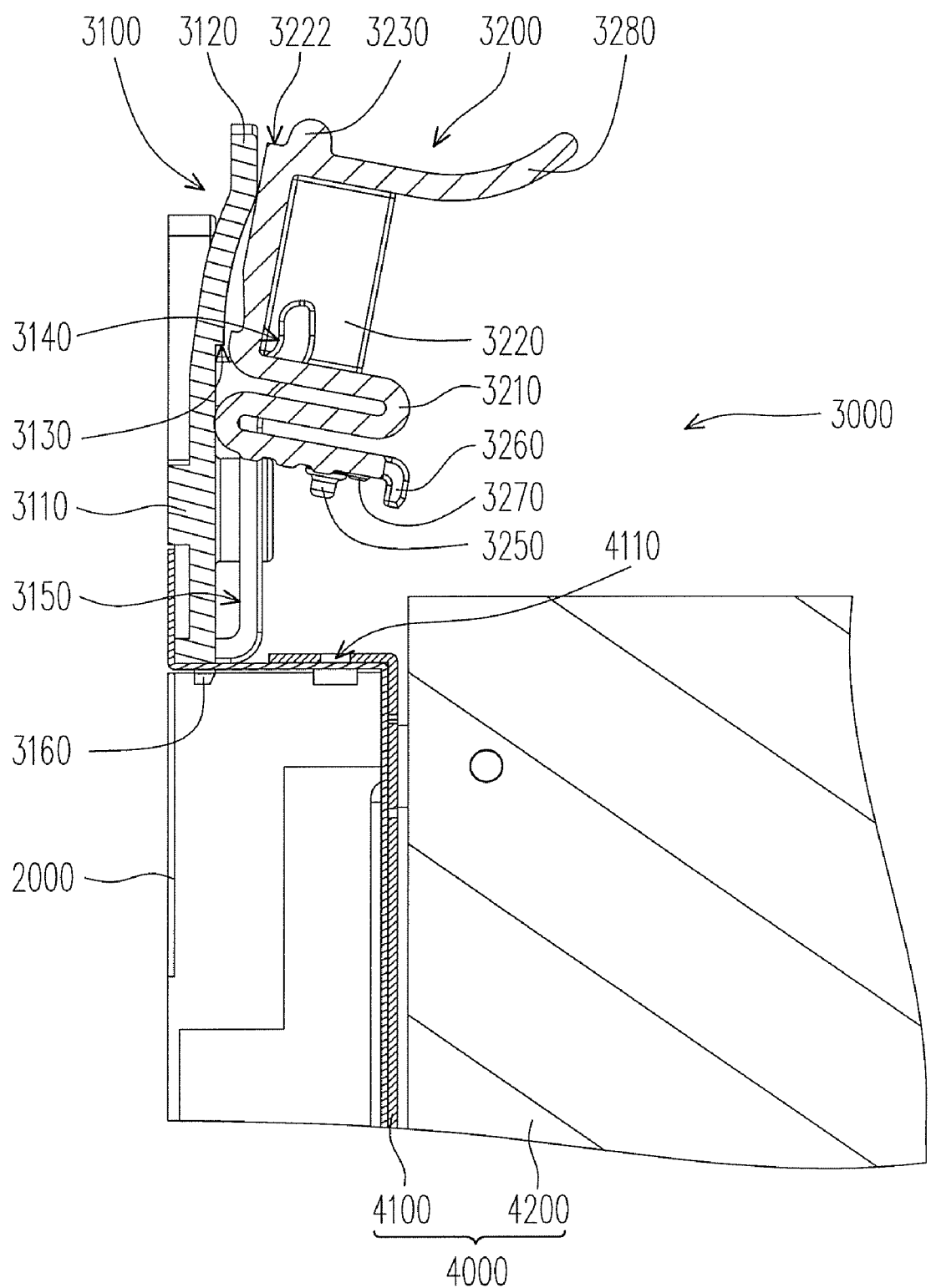
FIG. 4B is a cross-sectional view depicted in FIG. 4A.

FIG. 4A is a side view of the fixing module depicted in FIG. 2 in an unlocked position, and FIG. 4B is a cross-sectional view depicted in FIG. 4A. Referring to FIGS. 4A and 4B, the first mounting portion 3160 of the base 3100 is inserted into the third mounting hole 2200 of the first bracket 2000, so that the base 3100 is mounted to the first bracket 2000. Then, the sliding element 3200 and the base 3100 are assembled together. In an alternative embodiment, the sliding element 3200 and the base 3100 are first assembled together, and the first mounting portion 3160 of the base 3100 is then inserted into the third mounting hole 2200 of the first bracket 2000 for mounting the base 3100 to the first bracket 2000.

When the sliding element 3200 is in an unlocked position, the fixing module 3000 does not fix the card module 4000 to the first bracket 2000. Specifically, the sliding element 3200 in this position does not contact the first constraining structure and is therefore not constrained by the first constraining structure 3130, and the guide pin 3240 can slide in the sliding slot 3150. In addition, the engagement of the guide pin 3240 in the sliding slot 3150 can make the sliding element 3200 connect to the base 3100. It should be noted that, in the present invention, the sliding element 3200 is in an unlocked position as long as the sliding element 3200 is not constrained by the first constraining structure and, therefore, the meaning of the unlocked position herein does not refer to a single specific position.

Figure 5A:
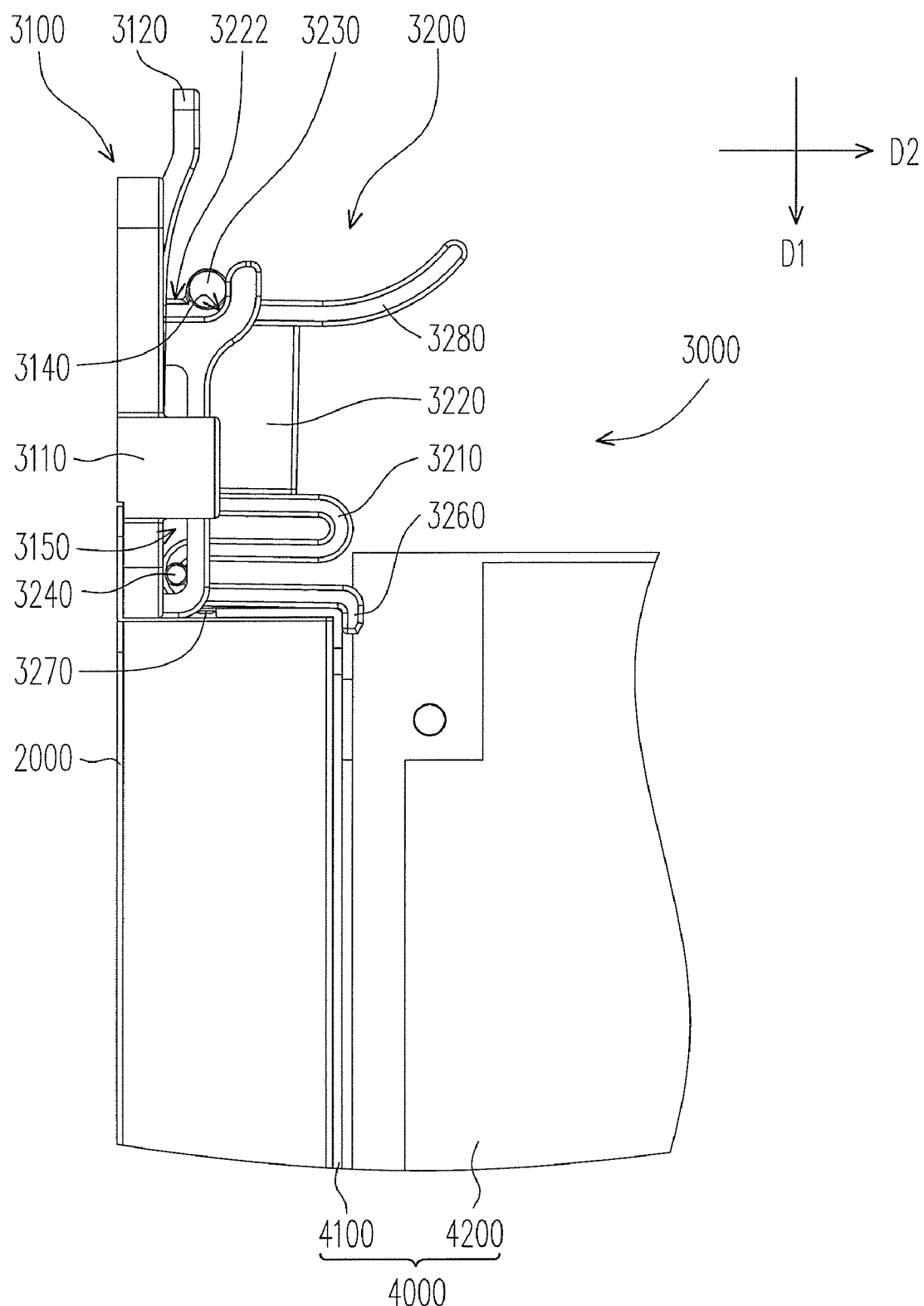
FIG. 5A is a side view of the fixing module depicted in FIG. 4A contacting the locking bracket.
Figure 5B:
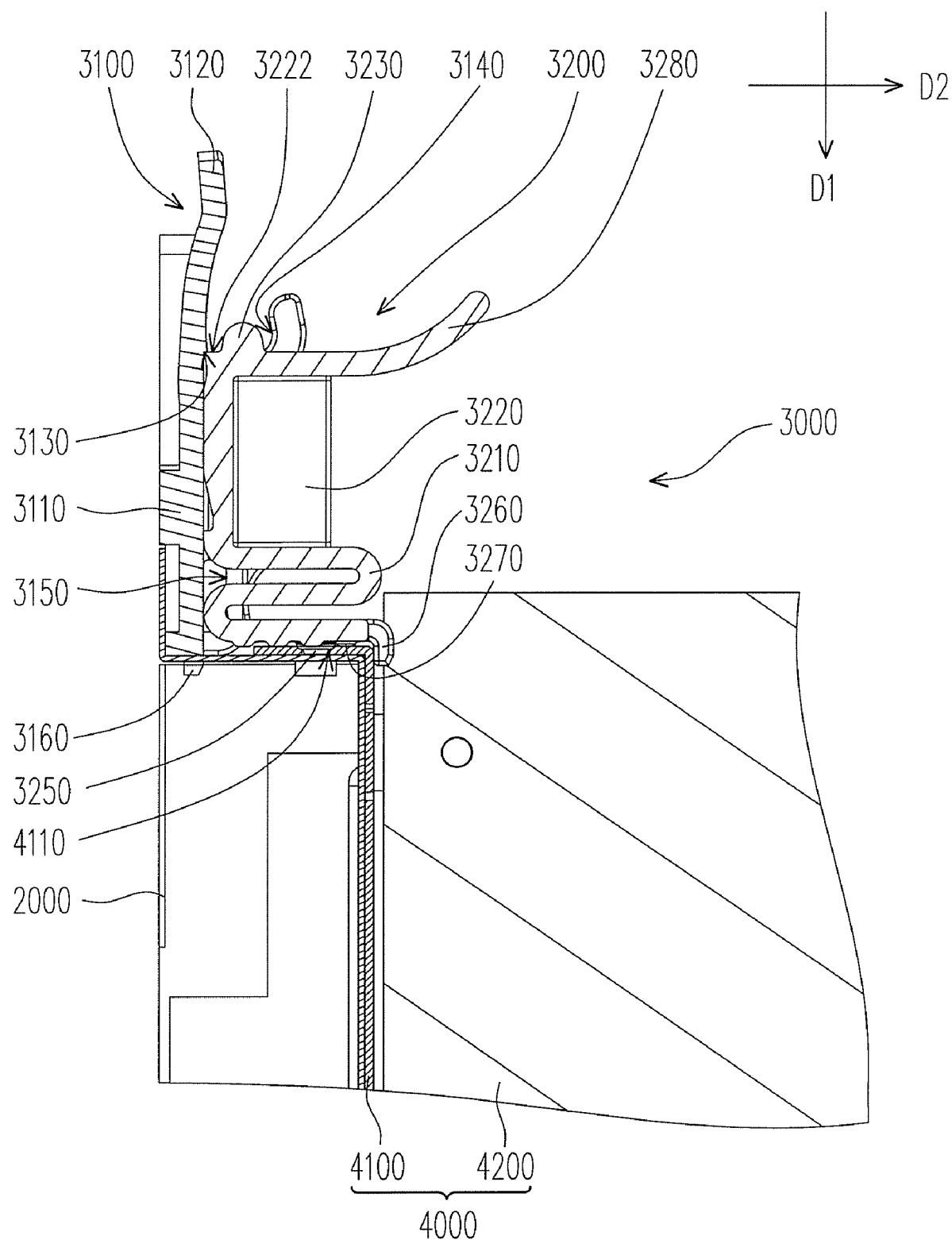
FIG. 5B is a cross-sectional view depicted in FIG. 5A.

FIG. 5A is a side view of the fixing module depicted in FIG. 4A contacting the locking bracket, and FIG. 5B is a cross-sectional view depicted in FIG. 5A. Referring to FIG. 5A and FIG. 5B, when the user exerts a force on the pushing portion 3280 of the sliding element 3200, with the guide pin 3240 engaged in the sliding slot 3150, the sliding element 3200 will be moved along the sliding slot 3150 in a first direction D1, making the resilient portion 3210 contact the locking bracket 4100. In this position, the protruding post 3250 is inserted into the second mounting hole 4110.

Figure 6A:
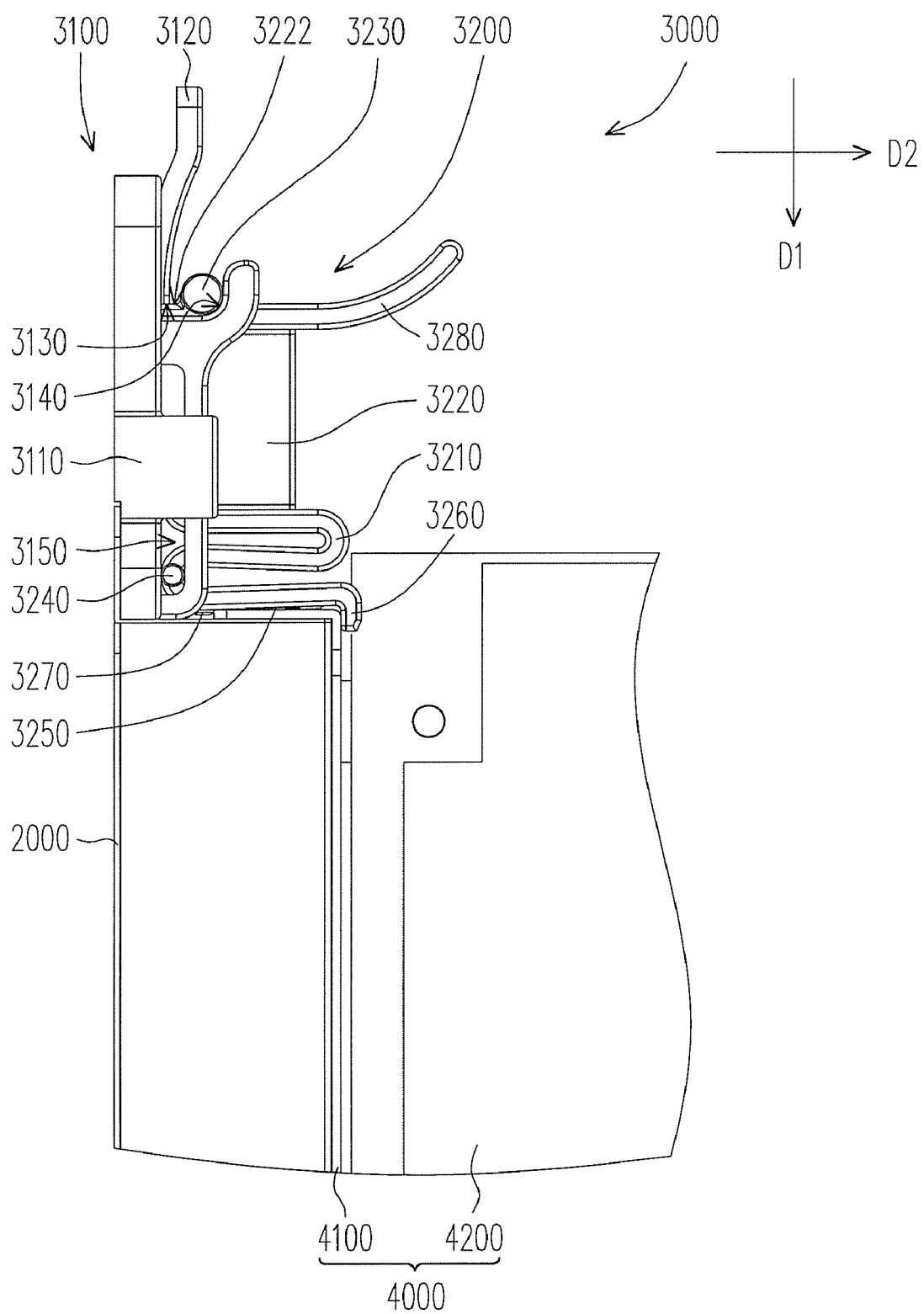
FIG. 6A is a side view of the fixing module depicted in FIG. 5A in a locked position.
Figure 6B:
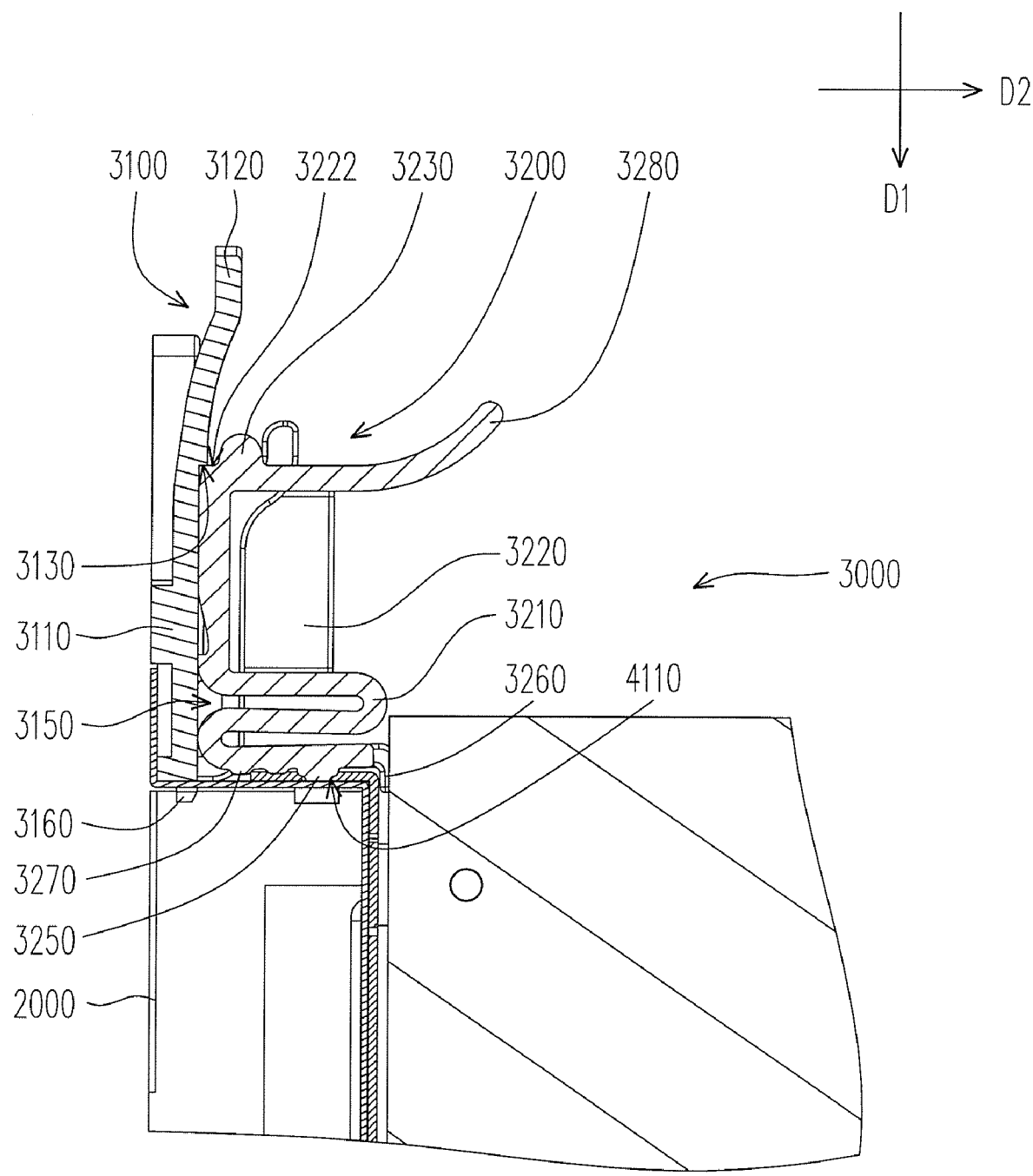
FIG. 6B is a cross-sectional view depicted in FIG. 6A.

FIG. 6A is a side view of the fixing module depicted in FIG. 5A in a locked position, and FIG. 6B is a cross-sectional view depicted in FIG. 6A. Referring to FIG. 6A and FIG. 6B, after the resilient portion 3210 contacts the locking bracket 4100, the user continues to exert the force on the pushing portion 3280 until the locking portions 3230 of the sliding element 3200 engages an end of the sliding slot 3140 to prevent further movement of the sliding element 3200 in the first direction D1. As a result, the sliding element 3200 is locked in a locked position. The locking bracket 4100 is effectively positioned on the first bracket 2000 under the pressing of the resilient portion 3210, such that the locking bracket 4100 of the card module 4000 is constrained between the fixing module 3000 and the first bracket 2000.

In the present embodiment, the resilient portion 3210 is, for example, S-shaped. However, the present embodiment does not limit the shape of the resilient portion 3210 to any particular shape. Rather, any shape is possible as long as the resilient portion 3210 can effectively press the locking bracket 4100. When the sliding element 3200 is slid to the locked position, the user stops exerting the force on the pushing portion 3280, and the first constraining structure 3130 constrains the movement of the body 3220 of the sliding element 3200 to prevent the sliding element 3200 from moving in a direction opposite to the first direction D1.

In addition, during the course of moving the sliding element 3200 to the locked position in which the sliding element 3200 is constrained by the first constraining structure 3130, the cantilever hook 3120 produces temporary elastic deformation under the compressing of a side portion 3222 of the sliding element 3200. After the sliding element 3200 is moved to the locked position, the side portion 3222 of the sliding element 3200 is accommodated in a space defined by the stepping structure which the stepping structure is formed between the cantilever hook 3120 and the carrying portion 3110, and the cantilever hook 3120 returns back under the influence of a resilient force to engage the side portion 3222 of the sliding element 3200. In this locked position, the locking portion 3230 is constrained in the locking slot 3140 above the cantilever hook 3120, thereby preventing the sliding element 3200 from moving in a second direction D2 that is perpendicular to the first direction D1.

It should be noted that, when the sliding element 3200 is in the locked position, the resilient portion 3210 is compressed to produce elastic deformation, and the surface of the resilient portion 3210 away from the body 3220 engages tightly with the locking bracket 4100. In addition, the protruding post 3250 formed on the surface of the resilient portion 3210 away from the body 3220 extends through the second mounting hole 4110 of the locking bracket 4100 and into the first mounting hole 2100 of the first bracket 2000 for securing the locking bracket 4100 to the first bracket 2000.

Furthermore, in the present embodiment, the locking bracket 4100 and the first bracket 2000 can contact closely with each other even if the surface of the locking bracket 4100 is uneven or the surfaces of the locking bracket 4100 and the resilient portion 3210 fail to closely contact. It is because that the ribs 3270 are formed on the surface of the resilient portion 3210 away from the body 3220. In other words, the provision of the ribs 3270 can increase the contact area when the resilient portion 3210 and the locking bracket 4100 contact, thereby making the locking bracket 4100 and the first bracket 2000 contact more closely with each other.

Moreover, when the sliding element 3200 is in the locked position, the second mounting portion 3260 protruding from the resilient portion 3210 in the moving direction (i.e., the first direction D1) of the sliding element 3200 leans against the locking bracket 4100 and cooperates with the first bracket 2000 to constrain a movement of the locking bracket 4100 in the second direction D2 perpendicular to the first direction D1. Besides, the stability of the mount of the locking bracket 4100 to the first bracket 2000 can be also increased because that the second mounting portion 3260 and the first bracket 2000 sandwich the locking bracket 4100 therebetween.

In view of the above description, the card module 4000 can be stably mounted to the first bracket 2000 using the fixing module 3000.

When it is desired to release the card module 4000 from the first bracket 2000, the acts of moving the sliding element 3200 from the locked position to the unlocked position are reverse to the acts of FIG. 4A through FIG. 6A. When the sliding element 3200 is in the locked position shown in FIG. 6A, the user first exerts a force on the cantilever hook 3120 such that the cantilever hook 3120 is moved in a direction reverse to the second direction D2 to disengage the body 3220 of the sliding element 3200 from the first constraining structure 3130 of the base 3100. Next, as shown in FIG. 5A, the resilient portion 3210 is compressed to produce elastic deformation when the sliding element 3200 is in the locked position, and, therefore, after the body 3220 of the sliding element 3200 is disengaged from the first constraining structure 3130, the resilient portion 3210 returns back under the influence of the elastic restoring force. In synchronous with the returning back of the resilient portion 3210, the elastic restoring force of the resilient portion 3210 moves the sliding element 3200 in a direction reverse to the first direction D1 to the unlocked position. As such, even through the user no longer exerts the force on the spring latch portion 3120, the body 3220 of the sliding element 3200 is released from the constraint by the first constraining structure 3130 of the base 3100. In this position, the fixing module 300 no longer constrains the locking bracket 4100 on the first bracket 2000 such that the card module 4000 can easily be removed.

The card module 400 can be quickly mounted or dismounted onto the case 1000 without using tools such as a screwdriver instead of using the fixing module 3000. Therefore, the fixing module 3000 and the case 1000 having the fixing module 3000 of the present embodiment is convenient for the users to use.

In summary, in the fixing module and the case having the fixing module of the present invention, the locking bracket of the card module can be mounted to the first bracket by manipulating the sliding element of the fixing module disposed on the base from an unlocked position to a locked position. When the card module is desired to be dismounted, the cantilever hook of the base can be simply pressed to disengage the sliding element from the first constraining structure, the sliding element can move from the locked position to the unlocked position under the influence of its own elastic restoring force, so that the card module can be readily dismounted. Tools such as the screwdriver are not required to the assembly of the card module and, therefore, it is convenient for the users to use.

In addition, when the sliding element is in the locked position, the resilient portion can closely contact the surface of the locking bracket, thereby increasing the stability of the mount of the locking bracket to the first bracket.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fixing module for fixing a card module to a bracket, the card module comprising a locking bracket and a card, the fixing module comprising:
   a base disposed on the bracket and comprising a carrying portion, a cantilever hook, and a first constraining structure; and
   a sliding element comprising a resilient portion and a body, the body being movably disposed on the carrying portion of the base, wherein when the sliding element is in a locked position, the first constraining structure is adapted to contact the body and constrain a movement of the body, and the resilient portion constrains the locking bracket of the card module on the bracket, and when a force is exerted on the cantilever hook to disengage the first constraining structure from the body, the sliding element is moved to an unlocked position under the influence of an elastic restoring force of the resilient portion.

2. The fixing module according to claim 1, wherein the first constraining structure is a stepping structure formed between the cantilever hook and the carrying portion.

3. The fixing module according to claim 1, wherein the base further has two locking slots, the sliding element further has two locking portions formed on a side of the body away from the resilient portion, and the locking portions are engaged in the locking slots when the sliding element is in the locked position.

4. The fixing module according to claim 1, wherein the base further has two sliding slots at opposite sides of the carrying portion, the sliding element further has two guiding pins on opposite sides of the resilient portion, and the guiding pins are movably disposed in the sliding slots.

5. The fixing module according to claim 1, wherein the bracket further has a mounting hole, the base further has a first mounting portion formed on a side of the carrying portion away from the cantilever hook, and the first mounting portion is configured to be inserted into the mounting hole of the bracket.

6. The fixing module according to claim 1, wherein the resilient portion of the sliding element is S-shaped.

7. The fixing module according to claim 1, wherein the bracket further has a first mounting hole, the locking bracket further has a second mounting hole, the sliding element further has a protruding post formed on a surface of the resilient portion away from the body, and the protruding post extends through the first mounting hole of the bracket and into the second mounting hole of the locking bracket when the sliding element is in the locked position.

8. The fixing module according to claim 1, wherein the sliding element further has a second mounting portion, and the second mounting portion protrudes from the resilient portion in a direction substantially parallel to the moving direction of the sliding element.

9. The fixing module according to claim 1, wherein the sliding element further has at least one rib formed on a surface of the resilient portion away from the body.

10. The fixing module according to claim 1, wherein the sliding element further has a pushing portion formed on a side of the body away from the resilient portion, for allowing a user to exert a force on the pushing portion.

11. A case for fixing a card module, the card module comprising a locking bracket and a card, the case comprising:
   a first bracket; and
   at least one fixing module, comprising:
      a base disposed on the first bracket and comprising a carrying portion, a cantilever hook, and a first constraining structure; and
      a sliding element comprising a resilient portion and a body, the body being movably disposed on the carrying portion of the base, wherein when the sliding element is in a locked position, the first constraining structure is adapted to contact the body and constrain a movement of the body, and the resilient portion constrains the locking bracket of the card module on the bracket, and when a force is exerted on the cantilever hook to disengage the first constraining structure from the body, the sliding element is moved to an unlocked position under the influence of an elastic restoring force of the resilient portion.

12. The case according to claim 11, wherein the first constraining structure is a stepping structure formed between the spring latch portion and a carrying portion.

13. The case according to claim 11, wherein the base further has two locking slots, the sliding element further has two locking portions formed on a side of the body away from the resilient portion, and the locking portions are engaged in the locking slots when the sliding element is in the locked position.

14. The case according to claim 11, wherein the base further has two sliding slots at opposite sides of the carrying portion, the sliding element further has two guiding pins at opposite sides of the resilient portion, and the guiding pins are movably disposed in the sliding slots.

15. The case according to claim 11, wherein the first bracket further has a mounting hole, the base further has a first mounting portion formed on a side of the carrying portion away from the cantilever hook, and the first mounting portion is configured to be inserted into the mounting hole of the first bracket.

16. The case according to claim 11, wherein the resilient portion of the sliding element is S-shaped.

17. The case according to claim 11, wherein the first bracket further has a first mounting hole, the locking bracket further has a second mounting hole, the sliding element further has a protruding post formed on a surface of the resilient portion away from the body, and the protruding post extends through the first mounting hole of the first bracket and into the second mounting hole of the locking bracket when the sliding element is in the locked position.

18. The case according to claim 11, wherein the sliding element further has a second mounting portion, and the second mounting portion protrudes from the resilient portion in a direction substantially parallel to the moving direction of the sliding element.

19. The case according to claim 11, wherein the sliding element further has at least one rib formed on a surface of the resilient portion away from the body.

20. The case according to claim 11, wherein the sliding element further includes a pushing portion formed at a side of the body away from the resilient portion, for allowing a user to exert a force on the pushing portion.

21. The case according to claim 11, further comprising a plurality of second brackets cooperating with the first bracket to form a container.

* * * * *